(12) United States Patent
Ramappa

(10) Patent No.: US 7,200,498 B2
(45) Date of Patent: Apr. 3, 2007

(54) SYSTEM FOR REMEDIATING CROSS CONTAMINATION IN SEMICONDUCTOR MANUFACTURING PROCESSES

(75) Inventor: Deepak A. Ramappa, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 188 days.

(21) Appl. No.: 10/853,867

(22) Filed: May 26, 2004

(65) Prior Publication Data
US 2005/0274805 A1 Dec. 15, 2005

(51) Int. Cl.
*G06F 19/00* (2006.01)

(52) U.S. Cl. .................. 702/58; 702/81; 702/128; 438/14; 438/17; 438/104; 438/935; 324/71.1; 324/71.5; 324/158.1

(58) Field of Classification Search ............ 702/58, 702/81, 84, 128; 438/14, 15, 17, 104, 935; 324/71.1, 71.5, 158.1
See application file for complete search history.

(56) References Cited

U.S. PATENT DOCUMENTS

| | | | | |
|---|---|---|---|---|
| 5,930,586 A | * | 7/1999 | Jain et al. | 438/14 |
| 5,943,552 A | * | 8/1999 | Koveshnikov et al. | 438/17 |
| 2005/0274322 A1 | * | 12/2005 | Lee et al. | 118/715 |

OTHER PUBLICATIONS

Vermeire et al., 'The Effect of Copper Contamination on Field Overlap Edges and Perimeter Junction Leakage Current', May 1998, IEEE Publication, vol. 11, No. 2, pp. 232-238.*

Ishiguro et al., 'Cleanroom Design for Cu-CMP Processes', Jan. 2000, IEEE Publication, pp. 11-14.*

Awaya et al., 'Evaluation of a Copper Metallization Process and the Electrical Characteristics of Copper-Interconnected Quarter-Micron CMOS', Aug. 1996, IEEE Publication, vol. 43, No. 8, pp. 1206-1212.*

Tee et al., 'Effects of Deliberate Copper Contamination from the Plating Solution on the Electrical Characteristic of MOSFET's ', May 2001, IEEE Publication, vol. 14, No. 2, pp. 170-172.*

Yli-Koski et al., 'Detection of Low-Level Copper contamination in P-type silicon by means of microwave photoconductive decay measurements', 2002, IOP Publication, pp. 13119-13125.*

* cited by examiner

Primary Examiner—Marc S. Hoff
Assistant Examiner—Elias Desta
(74) Attorney, Agent, or Firm—Peter K. McLarty; W. James Brady, III; Frederick J. Telecky, Jr.

(57) ABSTRACT

The present invention defines a system (100) for detecting copper contamination within a semiconductor manufacturing process. According to the present invention, a semiconductor wafer (102) is transferred (108) from a semiconductor manufacturing component (104), which may have exposed the wafer to copper contamination, to a measurement system (106). The measurement system measures an electrical value at a plurality of locations along a surface of the wafer, prior to and after exposure of the surface to an activation system (112). The activation system is provided to cause any copper contamination along the surface to form a precipitate thereon. An analysis component (110) is provided to receive electrical value and location information from the measurement system and to identify, from the measurements, the presence and location of copper contamination along the semiconductor wafer surface.

25 Claims, 1 Drawing Sheet

SYSTEM FOR REMEDIATING CROSS CONTAMINATION IN SEMICONDUCTOR MANUFACTURING PROCESSES

TECHNICAL FIELD OF THE INVENTION

The present invention relates generally to the field of semiconductor manufacturing processes and, more particularly, to apparatus and methods for detecting and remediating cross contamination in certain device fabrication processes.

BACKGROUND OF THE INVENTION

The continual demand for enhanced integrated circuit performance has resulted in, among other things, a dramatic reduction of semiconductor device geometries, and continual efforts to optimize the performance of every substructure within any semiconductor device. A number of improvements and innovations in fabrication processes, material composition, and layout of the active circuit levels of a semiconductor device have resulted in very high-density circuit designs. Increasingly dense circuit design has not only improved a number of performance characteristics, it has also increased the importance of, and attention to, semiconductor material properties and behaviors.

The increased packing density of the integrated circuit generates numerous challenges to the semiconductor manufacturing process. Nearly every device must be smaller without degrading operational performance of the integrated circuitry. High packing density, low heat generation, and low power consumption, with good reliability must be maintained without any functional degradation. Increased packing density of integrated circuits is usually accompanied by smaller feature size.

As integrated circuits become denser, the widths of metal structures interconnecting transistors and other devices within an integrated circuit are reduced. As the width of metal interconnects decrease, their resistance increases. As a result, semiconductor manufacturers seek to create smaller and faster devices by using newer, alternative materials (e.g., copper, tungsten) to form metallic interconnect structures, instead of more traditional semiconductor materials (e.g., aluminum).

The introduction of alternative materials, such as copper, has successfully addressed certain performance concerns—so much so that those materials are now used extensively throughout many manufacturing processes. Performance advantages provided by such materials, however, have not come without cost. Certain physical and behavioral properties of these alternative materials can cause of number of problems during the manufacture, testing or operation of a semiconductor. Copper, for example, is known to be an extremely active and atomically mobile material. In many semiconductor devices, copper can and will diffusively migrate from a metallic structure to a collateral, non-metallic structure unless certain measures are taken to limit such diffusion. Copper contamination of non-cupric semiconductor materials can significantly degrade device parametric performance, or cause complete device failure altogether. This naturally results in a number of yield and reliability problems.

Intra-device copper diffusion is not the only potential source of copper contamination problems. In a number of instances, non-cupric semiconductor materials—especially front-end materials (e.g., silicon compounds, oxides) can become contaminated with copper—generally a back-end metallization material—at a variety of stages during the fabrication process. Cross-contamination can occur in or at a number of processing systems or stations (e.g., device inspection, cleaning chambers), since such systems must be used to process multiple devices at various stages throughout the front-end and back-end processes. For many manufacturers, it is not economically feasible or efficient to employ separate, redundant equipment for front-end/back-end materials and processes, solely for the sake of avoiding cross-contamination. Often, therefore, potentially harmful cross-contamination is mitigated by other means.

One approach to mitigating such cross-contamination involves inspecting representative samples, pulled from a production line immediately after processing or handling by a particular system or station (e.g., a wet clean system), for contaminants. If an unacceptable level of a contaminant is detected, the system or station in question is determined to be contamination and cleaned or decontaminated accordingly. Semiconductor wafers processed by the system or station in question, since the last satisfactory inspection, may then be individually examined or inspected for contamination, or scrapped.

There are, however, a number of issues that typically arise in conventional copper contamination inspection methods and systems. One issue concerns the frequency of inspections conducted. Commonly, representative samples are inspected on only a periodic basis. Inspections may occur once or twice per shift, or even once or twice per day. With a period of hours between inspections, a contaminated system or tool may have processed or handled a very large number of semiconductor wafers (e.g., >100). Once copper contamination has been detected in a particular system or tool, processing must stop to facilitate decontamination of the tool. Furthermore, each of the semiconductor wafers processed by that system or tool, since its last satisfactory inspection, must either be scrapped or individually inspected. Either way, time and money are wasted and lost.

Additionally, in many cases, conventional copper contamination inspection methods and systems require the removal of semiconductor wafers from the production line, to be taken to a separate contamination monitoring or detection system or apparatus. This introduces a certain degree of inefficiency into the production process. Many conventional inspection systems and methods are also rather time-consuming—often taking an hour or more to provide a complete analysis. Besides further increasing inefficiency of the process, a long inspection time allows for a large number of wafers to be processed by a potentially contaminated system or tool.

Another concern involves conventional contamination detection systems that rely on invasive contact with, or partial or complete dissolution of, the surface of the wafer being as tested. Where such detection systems are utilized, semiconductor wafers are therefore generally scrapped after inspection. Moreover, many conventional copper contamination detection systems and methods provide little, if any, indication of the specific position or source of copper contamination within a particular processing system or tool. Frequently, for example, contamination is determined by the amount of copper present in a given volume of dissolved semiconductor wafer.

As a result, there is a need for a versatile system for detecting and remediating cross-contamination, particularly copper cross-contamination, in semiconductor manufacturing processes. There is a further need for a versatile system that non-invasively detects and remediates cross-contamination—one that operates in-line and accurately indicates contamination origin(s)—providing timely, non-destructive remediation in an easy, efficient and cost-effective manner.

SUMMARY OF THE INVENTION

The present invention provides a versatile system for detecting and remediating cross-contamination, particularly copper cross-contamination, in semiconductor manufacturing processes. The present invention provides a versatile remediation system that operates, in-line, within semiconductor manufacturing equipment and processes—efficiently streamlining cross-contamination testing. With the present invention, semiconductor wafers are inspected for cross-contamination in a non-invasive, non-destructive manner—eliminating any yield loss due solely to testing. The remediation system of the present invention also provides specific indication of cross-contamination location(s), which provides the ability to quickly identify and remediate the origin(s) or source(s) of cross-contamination. The present invention thus provides timely, non-destructive remediation of semiconductor cross-contamination in an easy, efficient and cost-effective manner.

The system of the present invention is readily implemented within high-volume semiconductor manufacturing processes, without substantial imposition on existing process flows or fabrication systems. A system according to the present invention may be implemented as a stand-alone system inserted into a manufacturing process, or may be implemented as an integrated component or module of an already-existing system within the manufacturing process. Specifically, the present invention provides a measurement system, an activation system, and an analytical system. Electrical behavior profiles of a suspect wafer are measured, before and after exposure to an activating source, and then analyzed to determine if and where contamination may be present. Specific results are provided, graphically or otherwise, in a matter of minutes—enabling timely efficient decontamination of a tool or system from which the wafer emerged.

The present invention provides, among other things, a system for detecting copper contamination within a semiconductor manufacturing process. According to the present invention, a semiconductor wafer is transferred, via a transfer system, from a semiconductor manufacturing component that may have exposed the wafer to copper contamination. A measurement system measures an electrical value at a plurality of locations along a surface of the wafer, prior to and after exposure of the surface to an activation system. The activation system is provided to cause any copper contamination along the surface to form a precipitate thereon. An analysis component is provided to receive electrical value and location information from the measurement system and to identify, from the measurements, the presence and location of copper contamination along the semiconductor wafer surface.

More specifically, the present invention provides a system for detecting copper contamination within a semiconductor manufacturing process, having a semiconductor manufacturing component. An activating system is adapted to expose a semiconductor wafer surface to an activation energy source. A measurement system is adapted to measure an electrical value at a plurality of locations along a semiconductor wafer surface, prior to and after exposure of the wafer surface to the activation energy source. A transfer system is adapted to transfer a semiconductor wafer from the semiconductor manufacturing component to the measurement system. An analysis component is adapted to receive electrical value and location information from the measurement system and to identify, from the measurements, the presence and location of copper contamination along a semiconductor wafer surface.

The present invention also provides a method of detecting copper contamination within a semiconductor manufacturing process. A semiconductor wafer is provided, and an initial surface barrier voltage is measured at a plurality of locations along a surface of the semiconductor wafer. The surface of the semiconductor wafer is exposed to an energy source sufficient to cause any copper along the surface of the semiconductor wafer to form a precipitate on the surface of the semiconductor wafer. A post exposure surface barrier voltage is measured at the plurality of locations along the surface of the semiconductor wafer. The initial and post exposure surface barrier voltage measurements, for each location, are then compared to detect a presence of copper contamination at that location.

The present invention further provides a method of remediating copper contamination within a semiconductor manufacturing process. A semiconductor wafer is provided, and an initial surface barrier voltage is measured at a plurality of locations along a surface of the semiconductor wafer. The surface of the semiconductor wafer is exposed to an energy source sufficient to cause any copper along the surface of the semiconductor wafer to form a precipitate on the surface of the semiconductor wafer. A post exposure surface barrier voltage is measured at the plurality of locations along the surface of the semiconductor wafer. The initial and post exposure surface barrier voltage measurements, for each location, are then compared to detect a presence of copper contamination at that location. Each location along the surface of the semiconductor wafer where copper contamination is detected is determined, and then correlated to a corresponding location of a processing system by which the semiconductor wafer was previously handled. Each corresponding location of the processing system is then remediated for copper contamination.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which.

DETAILED DESCRIPTION OF THE INVENTION

Figure 1:
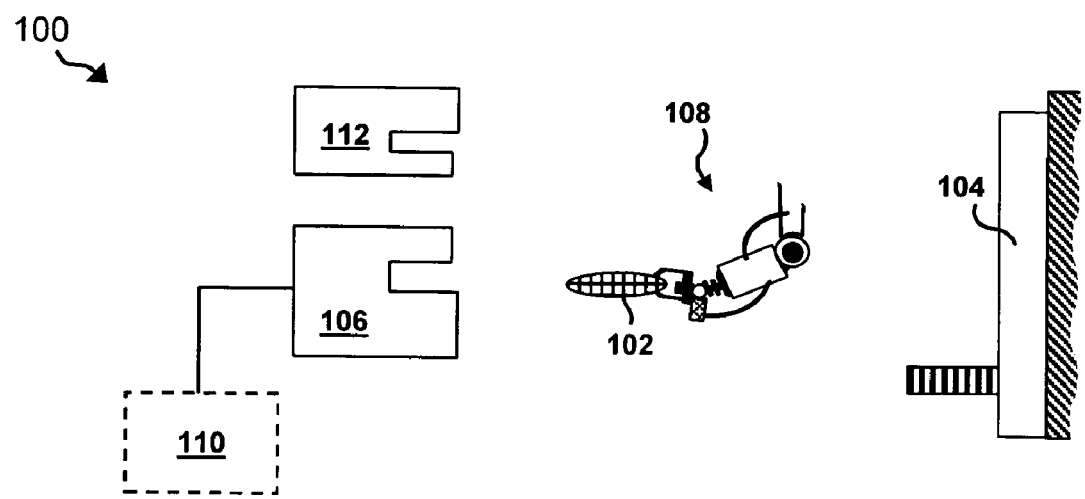
FIG. 1 is an illustration depicting one embodiment of a contamination detection system according to the present invention.

While the making and using of various embodiments of the present invention are discussed in detail below, it should be appreciated that the present invention provides many applicable inventive concepts, which can be embodied in a wide variety of specific contexts. The invention will now be described and illustrated in conjunction with a system for remediating copper cross-contamination occurring in a semiconductor manufacturing process. The specific embodiments discussed herein are, however, merely illustrative of specific ways to make and use the invention and do not limit the scope of the invention.

A remediation system according to the present invention operates in-line within a semiconductor manufacturing process. Time and labor are not lost transferring test wafers to a detection or inspection system. Instead, inspection of test wafers, or wafers suspected of having cross-contamination, is streamlined within the manufacturing or process flow. A remediation system according to the present system tests or otherwise inspects a wafer in a non-destructive manner—measuring certain capacitive profiles from just above the surface of a wafer. Wafers undergoing examination are thus not damaged or altered, eliminating any yield loss due solely to testing. Furthermore, a remediation system according to the present invention measures capacitive data at a large number of points across a wafer, providing a specific and accurate mapping of cross-contamination location(s). Locations of contamination across the wafer are correlated to the wafer's previous position within a contaminated apparatus or system, identifying one or more specific origins or sources of cross-contamination. Decontamination effort may thus be focused primarily on the specific contamination source(s), saving substantial time, effort and money.

The present invention recognizes that copper, and other similar materials within semiconductor processes, exhibit unique behaviors and characteristics that may be profiled and utilized to detect their presence in a variety of situations. The present invention further recognizes that the surface of a semiconductor wafer is generally a natural gettering area, and thus an opportune location for early detection of copper contamination in non-cupric materials. According to the present invention, the unique behavioral profile of copper is exploited to differentiate its presence, at a wafer's surface, from the presence of other materials. The present invention thus detects copper cross-contamination and provides an accurate mapping of copper presence on a wafer.

Since, as previously discussed, many tools and systems are utilized repetitively throughout multiple stages of a semiconductor manufacturing process, the possibility of cross-contamination of certain materials is relatively high—particularly in the case of copper. Systems or tools that come in direct contact with wafers (e.g., holding chucks, chemical bath enclosures) are susceptible to cross-contamination by residual copper compounds (e.g., precipitates). For example, cleaning baths are commonly used for several wafer lots before being cleansed and replenished. Any copper that dissociates from a wafer during cleaning thus contaminates the cleaning bath. That copper then has direct access to non-cupric materials during subsequent cleaning(s), and often contaminates those materials.

In response, the present invention provides a remediation system that may be integrated, either in a stand-alone or component configuration, within the manufacturing process to detect such cross-contamination. Detection and remediation systems according to the present invention may be implemented as components or modules of other systems (e.g., cleaning tools) that are susceptible to cross-contamination. Alternatively, detection and remediation systems according to the present invention may be implemented "downstream" of other systems that are susceptible to cross-contamination.

Referring now to FIG. 1, a remediation system 100 according to the present invention is illustrated. System 100 is configured to inspect a semiconductor wafer 102 for copper contamination, after wafer 102 is processed by a manufacturing component 104. Component 104 may comprise any semiconductor processing tool, system or sub-system that directly or indirectly handles or otherwise processes both wafers having copper metallization and wafers without copper metallization (e.g., a chuck for holding a wafer, a chemical cleaning bath or chamber).

After processing by component 104, wafer 102 is analyzed by a measurement system 106. In certain embodiments, wafer 102 may be transferred to a certain location for analysis by system 106, either within system 106 or in close proximity thereto. This transfer may be performed by an automated transfer system 108 (e.g., robotic assembly) or, in certain alterative embodiments, performed by manual transfer. In certain embodiments, measurement system 106 may be a stationary or otherwise fixed apparatus. In alternative embodiments, system 106 may be adapted to move, automatically or manually, into position around or near wafer 102. System 106 performs an initial analysis or characterization of the upper surface of wafer 102, and communicates that information to an analysis or processing component 110. System 106 is adapted to measure some electrical value (e.g., a voltage, capacitance), or to otherwise characterize a surface behavior or property, at some number of points or areas along the surface of wafer 102 in a relatively short amount of time, depending upon the desired or required remediation precision or time. For example, system 106 may characterize several hundred locations along the surface of wafer 102 in several minutes, or it may characterize several thousand locations in about 10–15 minutes.

After system 106 performs its initial analysis, wafer 102 is then introduced to an activating system 112. Wafer 102 may be transferred to system 112 by transfer system 108, or by some other automated or manual transfer system. In certain embodiments, wafer 102 may stay in a stationary position while system 112 is brought into operation proximity with wafer 102. Activating system 112 introduces an activating source of energy (e.g., high-intensity light) sufficient to cause any contaminants on the upper surface of wafer 102 to is form precipitates. In certain embodiments, a visible white light source is provided as the source of activation energy. In other alternative embodiments, other sources of sufficient activation energy (e.g., a microwave source), capable of control and performance in accordance with the present invention, may be provided.

In contrast, conventional bulk diffusion characterizations generally rely on whole-wafer, thermal activations (e.g., anneals) to drive contaminants into the wafer's silicon bulk for characterization. In such approaches, typically, all portions of a wafer—from surface through bulk—are activated and induced to change phase. Such approaches require extra processing overhead to perform the thermal activations, and typically introduce additional sources of potential contamination (e.g., anneal furnace).

According to the present invention, however, system 112 limits full exposure to an activation source only to the potentially contaminated surface area of wafer 102. Thus, only contaminants on or near the surface of wafer 102 are induced to change phase. System 112 exposes wafer 102 for a period of time sufficient to cause surface copper, and interstitial copper near the surface, to form a precipitate. It is possible that, under certain conditions, this treatment by system 112 can cause some common semiconductor contaminants (e.g., iron, boron), other than copper, to change phase as well. Generally, however, such other contaminants require higher active temperature ranges than copper in order to maintain phase change. Thus, according to the present invention, treatment by system 112 occurs within a relatively low temperature range (e.g., ~50° C.–150° C.) favorable to maintaining copper—but not other contaminant—phase change. Furthermore, unlike copper, such contaminants typically recombine within a relatively short amount of time. Thus, according to the present invention, a delay period is introduced after wafer 102 is treated by system 112. This delay period is of a sufficient time (e.g., ~10–15 minutes) to allow non-copper contaminants to recombine, while keeping copper in precipitate form.

In certain embodiments, wafer 102 may be transferred to a certain location for treatment by system 112, either within system 112 or in close proximity thereto. This transfer may be performed by system 108 or by manual transfer. In certain embodiments, measurement system 112 may be a stationary or otherwise fixed apparatus. In alternative embodiments, system 112 may be adapted to move, automatically or manually, into position around or near wafer 102.

After the post-activation delay period, wafer 102 is again analyzed by system 106. System 106 performs one or more post-activation analyses or characterizations of the upper surface of wafer 102, and communicates that information to an analysis or data processing component 110. Component 110 compares and analyzes the pre and post activation surface measurement profile data that it receives, and determines the extent and location of any differences therein. Such differences may then be analyzed, reported, displayed or otherwise communicated (e.g., graphically, numerically) to indicate the presence, extent and location of copper contamination on wafer 102. This information may then be correlated to the relative position of wafer 102 within system 104, identifying likely source(s) of contamination therein. Efforts to clean system 104, if required at all, may then be efficiently focused on contaminated areas or components. Furthermore, this entire detection and remediation process can be performed in a matter of minutes, not hours—providing for much more efficient and timely contamination remediation.

Figure 2:
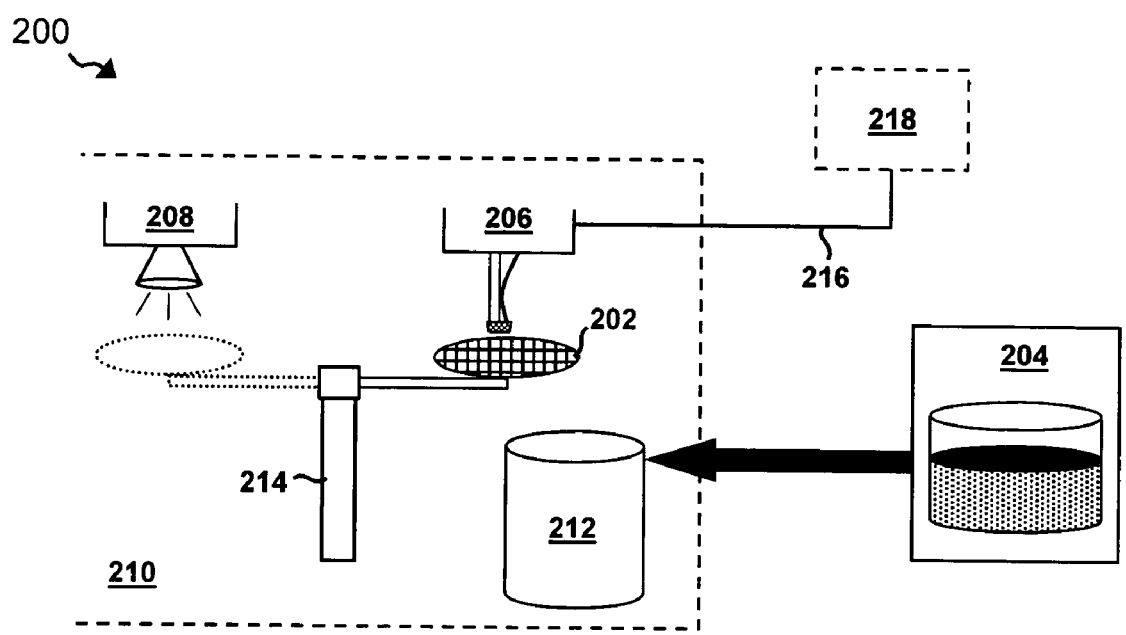
FIG. 2 is an illustration depicting another embodiment of a contamination detection system according to the present invention.

Certain aspects of the present invention are presented in greater detail with reference to the specific embodiments that follow hereafter, beginning with reference to a remediation system 200 as depicted in FIG. 2. System 200 is configured to inspect a p-type semiconductor wafer 202 for copper contamination, after wafer 202 emerges from a chemical cleaning bath 204. System 200 further comprises a measurement system 206 and an activation system 208. In the embodiment depicted in FIG. 2, systems 206 and 208 are provided within a surface photovoltage (SPV) measuring system 210 (e.g., the 220 FAaST Tool from Semiconductor Diagnostics, Inc.). In system 200, system 206 comprises an SPV probe within system 210. System 208 comprises an optical flooding station within system 210.

After emerging from bath 204, p-type wafer 202 is transferred into the load lock 212 of system 210, and carried by a robotic assembly 214 into proximity with the SPV probe 206. Probe 206 is utilized to measure the surface barrier voltage ($V_{SB}$) of wafer 202, at some desired number of points (e.g., 3000) along or across the surface of wafer 202. The probe is brought into very close proximity just above the surface of wafer 202, but it does not touch or otherwise damage wafer 202. System 206 communicates information on the $V_{SB}$ measurements for, and their relative positions along, wafer 202, via communicative link 216 to analysis system 218. System 218 may comprise any suitable manual or automated data processor component, integrated within tool 210, or external to it. For example, system 218 is may comprise a data processing routine (e.g., software), running on a processor, in a remote computer terminal that is communicatively coupled to tool 210.

After system 206 completes these pre-activation measurements, wafer 202 is then transferred to optical flooding system 208. The temperature within system 218 is held at temperature range (e.g., ~75° C.–150° C.) favorable to maintaining copper phase change. Within system 208, wafer 202 is exposed to high-intensity visible light (e.g., ~5 W–7 W) in an iterative succession (e.g., 20 seconds on, 20 seconds off) for a period of time sufficient to cause copper at the surface of wafer 202 to precipitate. The light energy activates the silicon lattice, and interstitial copper (i.e., contamination) is released and stimulated into forming precipitate along the wafer surface. As the copper changes phase, its capacitive properties change. This alters the effect of its presence on a surface barrier voltage measurement taken at a point where such copper is present. After activation by the light source is complete, a delay period of about 10 to 15 minutes is introduced before wafer 202 is transferred back to system 206.

After the post-activation delay period is over, wafer 202 is transferred back to, and again analyzed by, system 206. System 206 performs post-activation $V_{SB}$ measurements along or across the surface of wafer 202, and communicates the post-activation $V_{SB}$ and relative position data to analysis system 218.

System 218 compares and analyzes the pre and post activation $V_{SB}$ data on a location-by-location basis. System 218 determines the extent, and identifies the location, of any differences between pre and post activation $V_{SB}$ values. Those differences may then be reported, displayed or otherwise communicated (e.g., graphically, numerically) to indicate the presence, extent and location of copper contamination on wafer 202. This information may then be correlated to the relative position of wafer 202 within the bath 204, identifying any likely source(s) of contamination therein. If significant contamination is detected, bath 204 may then be efficiently cleaned and replenished. This entire detection and remediation process can easily be performed in less than an hour—providing for much more efficient and timely contamination remediation. Monitoring and detection can be performed on a continual basis, reducing the number of potentially contaminated wafers processed between contamination tests or inspections.

Thus, according to the present invention, a versatile system for detecting and remediating cross-contamination, particularly copper cross-contamination, operates in-line within semiconductor manufacturing equipment and processes—efficiently streamlining cross-contamination testing. A system according to the present invention may be implemented as a stand-alone system inserted into a manufacturing process, or may be implemented as an integrated component or module of an already-existing system within the manufacturing process. With the present invention, semiconductor wafers are inspected for cross-contamination in a non-invasive, non-destructive manner. The remediation system of the present invention provides specific indication of cross-contamination location(s). Specific results are provided, graphically or otherwise, in a matter of minutes—enabling timely efficient decontamination of a tool or system from which the wafer emerged.

The embodiments and examples set forth herein are presented to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. For example, the principles and teachings of the present invention may be applied to the detection and characterization of contaminant materials other than copper (e.g., iron). Many other modifications and variations are possible in light of the above teaching without departing from the spirit and scope of the following claims.

What is claimed is:

1. A system for detecting copper contamination within a semiconductor manufacturing process, the system comprising:
   a semiconductor manufacturing component;
   an activating system, adapted to expose a semiconductor wafer surface to an activation energy source, wherein the activation energy source comprises a light source;
   a measurement system, adapted to measure an electrical value at a plurality of locations along a semiconductor wafer surface, prior to and after exposure of the wafer surface to the activation energy source;
   a transfer system, adapted to transfer a semiconductor wafer from the semiconductor manufacturing component to the measurement system; and
   an analysis component, adapted to receive electrical value and location information from the measurement system and to identify, from the measurements, the presence and location of copper contamination along a semiconductor wafer surface.

2. The system of claim 1, wherein the activating system and the measurement system are collocated within a single tool.

3. The system of claim 2, wherein the single tool comprises a second transfer system adapted to transfer a semiconductor wafer between the activating system and the measurement system.

4. The system of claim 2, wherein the single tool comprises a surface photovoltage measuring system.

5. The system of claim 1, wherein the light source is a visible light source.

6. The system of claim 5, wherein the visible light source provides energy within the range of about 5 W to 7 W.

7. The system of claim 1, wherein the activating system is adapted to maintain a semiconductor wafer at a temperature of about 50° C. to about 150° C.

8. The system of claim 1, wherein the activating system is adapted to maintain a semiconductor wafer at a temperature of about 75° C. to about 150° C.

9. The system of claim 1, wherein the measurement system comprises a probe adapted to measure surface barrier voltage at a point along a semiconductor wafer surface.

10. The system of claim 1, wherein the analysis component comprises a data processing routine running on a processor that is communicatively coupled to the measurement system.

11. A method of detecting copper contamination within a semiconductor manufacturing process, the method comprising the steps of:
    providing a semiconductor wafer;
    measuring an initial surface barrier voltage at a plurality of locations along a surface of the semiconductor wafer;
    exposing the surface of the semiconductor wafer to an energy source sufficient to cause any copper along the surface of the semiconductor wafer to form a precipitate on the surface of the semiconductor wafer;
    measuring a post exposure surface barrier voltage at the plurality of locations along the surface of the semiconductor wafer; and
    comparing, for each location, the initial and post exposure surface barrier voltage measurements and using differences between the initial and post exposure surface barrier voltage measurements to detect a presence of copper contamination at that location.

12. The method of claim 11, wherein the step of providing a semiconductor wafer further comprises providing a p-type semiconductor wafer.

13. The method of claim 11, wherein the step of measuring an initial surface barrier voltage at a plurality of locations further comprises measuring an initial surface barrier voltage for at least 100 locations.

14. The method of claim 11, wherein the step of measuring an initial surface barrier voltage at a plurality of locations further comprises measuring an initial surface barrier voltage for at least 1000 locations.

15. The method of claim 11, wherein the step of exposing the surface of the semiconductor wafer to an energy source further comprises exposing the surface to a visible light source.

16. The method of claim 15, wherein the surface of the semiconductor wafer is exposed to the visible light source in 20 second on/off intervals.

17. The method of claim 16, wherein the surface of the semiconductor wafer is exposed to the visible light source for a total of 2 minutes.

18. The method of claim 11, further comprising a providing a delay between exposing the surface of the semiconductor wafer and measuring a post exposure surface barrier voltage.

19. The method of claim 18, wherein the delay is approximately 10 minutes.

20. The method of claim 18, wherein the delay is approximately 15 minutes.

21. The method of claim 11, further comprising the step of maintaining the semiconductor wafer at a desired temperature between initial surface barrier voltage measurement and post exposure surface barrier voltage measurement.

22. The method of claim 21, further comprising the step of maintaining the semiconductor wafer at a temperature of about 50° C. to 150° C.

23. The method of claim 21, further comprising the step of maintaining the semiconductor wafer at a temperature of about 75° C. to 150° C.

24. A method of remediating copper contamination in a semiconductor manufacturing process, the method comprising the steps of:
    providing a semiconductor wafer;
    measuring an initial surface barrier voltage at a plurality of locations along a surface of the semiconductor wafer;
    exposing the surface of the semiconductor wafer to an energy source sufficient to cause any copper along the surface of the semiconductor wafer to form a precipitate on the surface of the semiconductor wafer;
    measuring a post exposure surface barrier voltage at the plurality of locations along the surface of the semiconductor wafer; and
    comparing, for each location, the initial and post exposure surface barrier voltage measurements to detect a presence of copper contamination at that location; determining each location along the surface of the semiconductor wafer where copper contamination is detected;

correlating each location of copper contamination along the surface of the semiconductor wafer to a corresponding location of a processing system by which the semiconductor wafer was previously handled; and remediating each corresponding location of the processing system.

25. The system of claim 1, wherein the light source is a microwave source.

* * * * *